United States Patent [19]

Brandhorst, Jr.

[11] 4,131,486
[45] Dec. 26, 1978

[54] BACK WALL SOLAR CELL

[75] Inventor: Henry W. Brandhorst, Jr., Berea, Ohio

[73] Assignee: The United States of America as represented by the Administrator of the National Aeronautics and Space Administration, Washington, D.C.

[21] Appl. No.: 899,123

[22] Filed: Apr. 24, 1978

Related U.S. Application Data

[63] Continuation-in-part of Ser. No. 760,771, Jan. 19, 1977, abandoned.

[51] Int. Cl.² .............................................. H01L 31/06
[52] U.S. Cl. ..................................... 136/89 SJ; 357/30
[58] Field of Search .......... 136/89 SJ, 89 SG, 89 CD; 357/30

[56] References Cited

U.S. PATENT DOCUMENTS

| | | | |
|---|---|---|---|
| 3,081,370 | 3/1963 | Miller | 136/89 |
| 3,757,123 | 9/1973 | Archer et al. | 250/338 |
| 3,948,682 | 4/1976 | Bordina et al. | 136/89 |
| 3,969,746 | 7/1976 | Kendall et al. | 357/30 |

*Primary Examiner*—John H. Mack
*Assistant Examiner*—Aaron Weisstuch
*Attorney, Agent, or Firm*—N. T. Musial; J. R. Manning; Gene E. Shook

[57] ABSTRACT

The application discloses a back-well cell, for example, a solar cell which comprises a first semiconductor material of one conductivity type with one face having the same conductivity type but more heavily doped to form a field region arranged to receive the radiant energy to be converted to electrical energy, and a layer of a second semiconductor material, preferably highly doped, of opposite conductivity type on the first semiconductor material adjacent the first semiconductor material at an interface remote from the heavily doped field region. Instead of the opposite conductivity layer, one may employ a metallic layer to form a Schottky diode. If the metallic Schottky diode layer is used, no additional back contact is needed. A contact such as a gridded contact, pervious to the radiant energy may be applied to the heavily doped field region of the more heavily doped, same conductivity material for its contact.

17 Claims, 4 Drawing Figures

U.S. Patent     Dec. 26, 1978     4,131,486
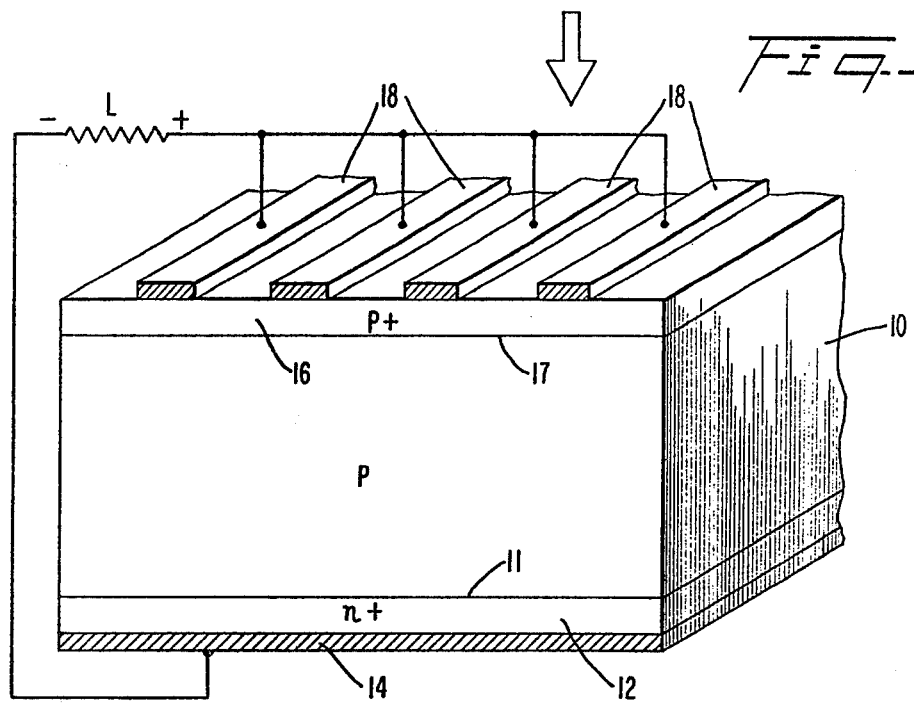
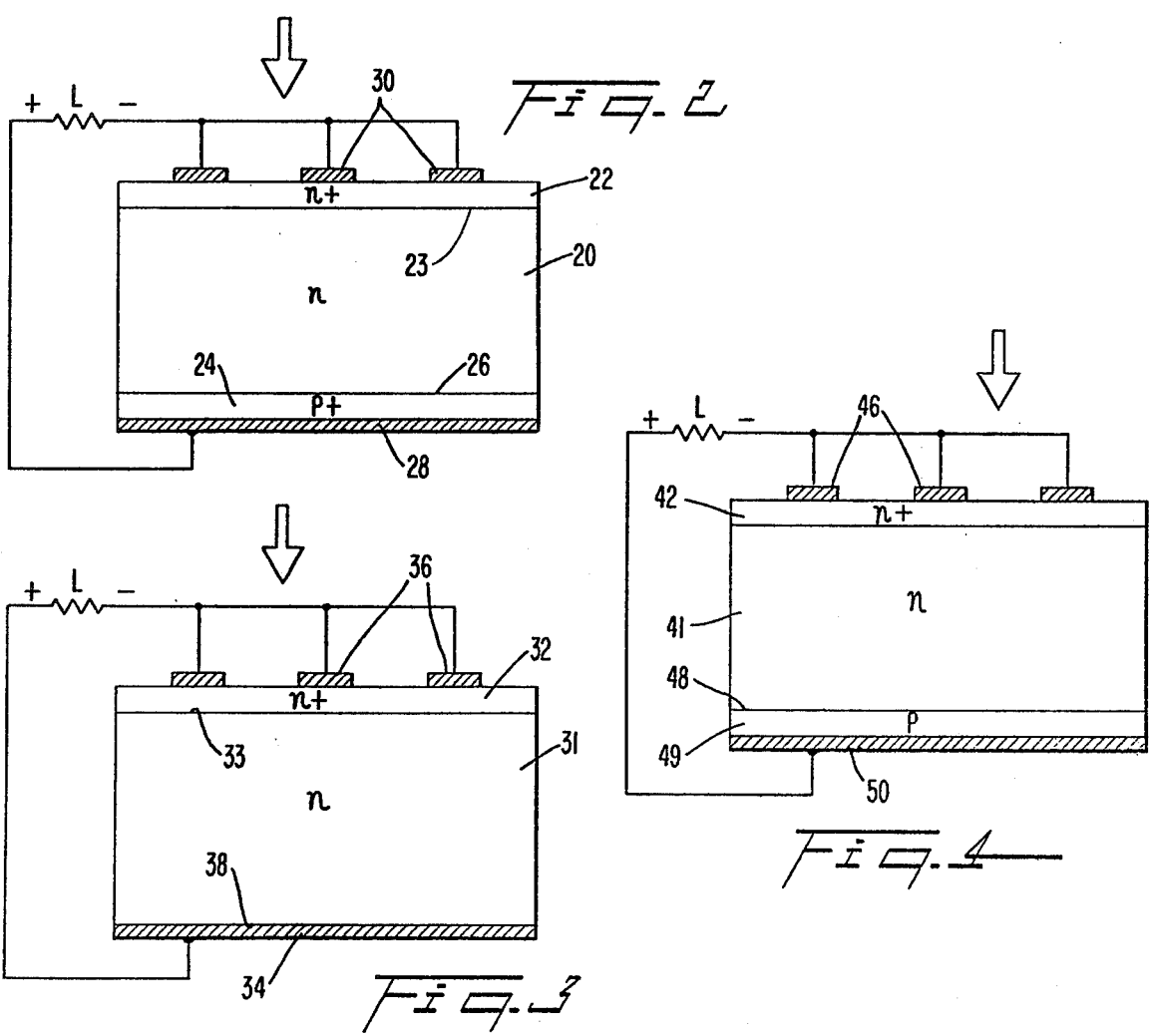

BACK WALL SOLAR CELL

ORIGIN OF THE INVENTION

The invention described herein was made by an employee of the United States Government and may be manufactured and used by or for the Government for governmental purposes without the payment of any royalties thereon or therefor.

STATEMENT OF COPENDENCY

This application is a continuation-in-part of application Ser. No. 760,771 which was filed Jan. 19, 1977, and now abandoned.

BACKGROUND OF THE INVENTION

The present invention relates to cells for the conversion of radiant energy to electrical energy, such as solar cells. The invention is particularly concerned with the type of cells known as back-wall cells.

In solar cells heretofore proposed, it has been known to provide on a first semiconductor material of one conductivity type, a thin layer of the opposite conductivity type semiconductor material forming between the interface a semiconductor p-n junction and arranged to receive the radiation. On the opposite face of the first semiconductor material may be applied a further semiconductor material of the same conductity type but of higher conductivity, that is, more highly doped. In operation, the radiant energy is received on the layer of opposite conductivity type, is absorbed and results in the formation of electron-hole pairs at or about the junction interface. The electrons are collected on the n material side of the junction, whereas the holes or positive carriers are collected on the p side of the junction. Accordingly, if suitable connection, such as a conductive grid, is provided on the radiation receiving layer, a suitable conductive connection to the further material of higher conductivity, and a load connected between them, a useful electrical current may be caused to pass through the load.

Such devices are described, for example in U.S. Pat. No. 3,359,137 to Stephen Kaye et al., issued Dec. 19, 1967 for "Solar Cell Configuration," U.S. Pat. No. 3,460,240 to Tarneja et al. issued Aug. 12, 1969 for "Manufacture of Semiconductor Solar Cells," and U.S. Pat. No. 3,462,311 to Ross issued Aug. 19, 1969 for "Semiconductor Device Having Improved Resistance to Radiation Damage." Other illustrative patents are U.S. Pat. No. 3,852,591 to Lee et al issued Dec. 3, 1974 for "Graded Band-Gap Semiconductor Photo Detector for Equalization of Optical Fiber Material Delay Distortion"; U.S. Pat. No. 3,838,439 to Biard, issued Sep. 24, 1974 for "Phototransistor Having a Buried Base"; and U.S. Pat. No. 3,675,026 to Woodall, issued July 4, 1972 for "Converter of Electromagnetic Radiation to Electrical Power."

SUMMARY OF THE INVENTION

According to the present invention, a back-wall cell is constructed having a first semiconductor material of one conductivity type, a region of the same conductivity type but of a higher conductivity, that is, more heavily doped overlying an exposed energy receiving surface of said first material, and a layer of a second material of opposite conductivity type applied to an opposite surface of said first material to form a p-n junction therewith. A metallic grid-type contact pervious to the radiant energy to be converted is applied to the heavily doped region thereby allowing penetration of the energy through the region and a back-wall contact is applied to the opposite conductivity type material.

In forming the device according to the invention, the more highly doped regions may be formed by epitaxy, diffusion, implantation, or a combination thereof. The first semiconductor material may be a single crystal, as may be the material applied to form the p-n junction. Instead of a p-n junction, a metallic layer forming a Schottky diode may be used. The p-n junction also may, if desired, be formed by epitaxy, diffusion, ion implantation, or by the use of another semiconductor material forming a heterojunction. Accordingly, the invention affords a greater latitude for the formation of the rectifying junction than has heretofore been available. The highly doped region reduces the sheet resistance of the surface of the cell so that a radiant energy pervious grid structure or the like applied to serve as contact to the region may provide a low resistance. This highly doped region also provides a blocking field which tends to prevent minority carriers from recombining at the surface and tends to increase the effective diffusion length of minority carriers thereby improving operation of the device.

BRIEF DESCRIPTION OF THE DRAWINGS

FIG. 1 is a schematic and diagrammatic view partially in section and partially isometric of a back-wall cell embodying the invention and comprising a p-type material with a $p^+$ region arranged to receive the radiation to be converted;

FIG. 2 is a schematic and diagrammatic view partially in section of another embodiment of the invention in which an n-type material carries an $n^+$ region on one face arranged to receive the radiation to be converted;

FIG. 3 is a schematic and diagrammatic view partially in section of still another embodiment of the invention in which a metallic layer forms a Schottky diode on one face of the n-type material to provide a rectifying junction; and FIG. 4 is a schematic and diagrammatic view partly in section of another embodiment of the invention employing an ordinary heterojunction.

DESCRIPTION OF THE PREFERRED EMBODIMENTS

Referring now to FIG. 1, a p-type material 10 in the shape of a wafer or a suitable rectangular parallelepiped block is illustrated. Any other shape (such as hexagonal or circular) is also applicable. The material 10 may be silicon doped with elements from group III A of the periodic table including boron and aluminum. The p-type semiconductor material 10 may be selected to have a resistivity as desired between approximately one thousand (1,000) to approximately one one-hundredth (0.01) ohm-centimeters. The material 10 has a thickness between about $5\mu M$ and $500\mu M$.

On a face of the p-type material opposite that from which the radiation is to be received, there is diffused an $n^+$ dopant from group VA of the periodic table, such as phosphorus, and arsenic, by any suitable known method, thereby to form a p-n junction 11 and an $n^+$ layer 12. The $n^+$ layer 12 may be of any desired thickness between about $0.1\mu M$ and $10.0\mu M$. The layer 12 is thereafter covered by any suitable known means with a metallic layer 14 to form the back contact. Because high conductivity is desired the n+ layer 12 is highly doped (preferably between $10^{18}$ and $10^{21}$ atoms/cc.

By diffusion or other of the aforementioned techniques a p-type dopant is applied to the face arranged to receive the radiation to form a thin p+ field region 16 and a p+-p junction 17. The region 16 has a thickness between about 0.1µM and 10.0µM (i.e. between about $10^{-7}$ to about $10^{-5}$ meters). On the p+ field region 16 are formed by chemiplating, evaporating, or other deposition techniques, a series of metallized areas 18 which may be connected in parallel in known manner, as schematically illustrated. A load L may be connected between the metallized areas 18 serving as an electrode and the back contact 14, serving as an electrode.

In operation, the radiant energy indicated by the arrow penetrates the spaces between the areas 18 and is received by the p+ field region 16 between the metallized areas 18. The radiation penetrates into the p-type material 10 where it is absorbed to create electron-hole pairs. An explanation is that light is absorbed and ruptures an electron-pair bond in the p-type silicon. An electron ejected by the rupture then is free to move through the crystal lattice, and so also is the "hole" left behind. The minority carriers (electrons) in the p-type silicon are impelled by the field created by the p-n junction 11 to move into the n-type layer. The charge carriers then pass through the external circuit and are returned to the p-type material in which they were formed. Here the excess electrons from the outer circuit or electrons they displace combine with the holes created by the radiant energy, to complete the process. Whether or not this is the correct explanation, the current flows in the external circuit in the direction indicated. In effect, the electrons of the electron-hole pairs in the material 10 tend to be drawn toward the p-n junction 11 and the holes tend to be repelled from the junction 11 so that there is created a flow of electron current from the back contact 14 toward the metallized areas 18 through an external load circuit connected as schematically indicated, the polarity being indicated by conventional signs at the load L.

The p+ field region 16 serves several functions. First it reduces the resistance of the surface of the cell so that the metallized areas 18 connected thereto pass current flow with a low resistance. The resistance of this layer may be made as low as that found in present cells, for example between about 10 and about 500 ohms/square. One of the important functions of the p+ field region 16 is to provide a blocking field that tends to prevent minority carriers from recombining at the surface. The field between the p-p+ junction 17 readily passes the majority carriers (holes) in the material 10 in the desired hole current flow direction, but tends to prevent the minority carriers (in this case electrons) from flowing in that same direction. Therefore, surface recombination tends to be suppressed. It has been found in at least one instance that effective surface recombination velocity of this arrangement is less than about $10^2$ cm/sec. compared to as much as about $10^5$ or $10^6$ cm/sec. for other cells. The presence of the p+ region 16 acts to increase the effective diffusion length of minority carriers. The increase of the effective diffusion length tends to improve device performance and enhance the current that may be derived from a specific amount of radiation. Moreover, the arrangement offers a wider latitude for the conditions of junction formation than is usually found. For example, very deep diffusion may be used to form a special junction profile for the junction 10 as well as varied doping conditions. If desired, either the region 16 or the layer 12 may be found by epitaxy or the other techniques mentioned.

In one successful embodiment corresponding to FIG. 1, the p-type material 10 was 10 ohm-cm., p-type silicon doped with boron to a level of about $1.3 \times 10^{15}$ boron atoms/cc. The p+ region 16 has a maximum concentration of about $2 \times 10^{20}$ boron atoms/cc. and was about 0.3µM thick. The n+ layer 12 was 0.25µM thick and was formed or doped by diffusion of phosphorus. Maximum phosphorus concentration was $2 \times 10^{20}$ atoms/cc. The wafer was a rectangular parallelepiped shape about 150 M thick and a face about 1 cm. $\times$ 2 cm.

Referring now to FIG. 2, n-type material 20 in the shape of a wafer or rectangular parallelepiped (other geometry may be employed) has on one face an n+ region 22, forming an n+-n junction 23. The region 22 may be formed by epitaxy, or by ion implanation diffusion as desired. On the opposite face is a p+ layer 24 formed by diffusion, or by ion implantation, as desired, which with the n-type material 20 forms a semiconductor junction 26. On the p+ tyle layer 24 is applied a solid electrode 28. On the n+ region 22 by any suitable method are applied metallic areas 30 pervious to the radiant energy to be converted and which are connected together to form an electrode for the n+ region 22. The circuit may be completed through a load L as shown.

The material 20 may be of silicon appropriately doped. Layer 24 may be a single crystal. Accordingly, there is a substantial flexibility in the manner in which the device of the invention may be constructed. The junction 26 may also be diffused to any desired depth.

The field between the n and n+ regions readily passes the majority carriers in the desired electron current flow direction but repels the minority carriers (in this case holes) from flow in that direction. Therefore, as before, surface recombination tends to be suppressed.

The operation of the arrangement of FIG. 2 is similar to that of the arrangement of FIG. 1 except that opposite conductivity types are employed for the semiconductor layers and, naturally, a current of a reversed polarity flows as indicated. Similar benefits are available from the low resistance at region 22, the tendency to prevent surface recombination, as explained above, and an increase of effective diffusion length of minority carriers. Wide latitude is also available in the formation of the p-n junction and in the formation of the n-n+ junction.

In an embodiment such as that of FIG. 2, the n-type material 20 was 10 ohm-cm. silicon doped with phosphorus to a level of about $5 \times 10^{14}$ phosphorus atoms/cc. The 0.25µM thick n+ region 22 was formed by phosphorus diffusion with a maximum surface concentration of about $2 \times 10^{20}$ atoms/cc. The 0.3µM thick p+ layer 24 was formed by diffusion of boron with a maximum surface concentration of about $2 \times 10^{20}$ atoms/cc. This wafer also was in the form of a rectangular parallelepiped about 150µM thick and a face of about 1 cm. $\times$ 2 cm.

Referring now to FIG. 3, an n-type material 31 in the shape of a rectangular parallelepiped (other geometry may be employed) carries an n+ field region 32 on one face. p-type and p+ type materials can also be used. On the opposite face is applied a metallic barrier layer 34 of gold, platinum, an alloy thereof, or similar metals to form with the material 31 a Schottky diode. A thin (20 Å) insulating layer of a material such $SiO_2$ may also be present between the metal and the silicon. On the region 32 are applied suitable metallic portions 36 arranged to admit the radiant energy to be converted to electrical energy. The portions 36 are connected together to form an electrode. A load L is connected between the electrode thus formed and the metallic layer 34.

The cell of FIG. 3 is arranged to receive the radiant energy on the face bearing the n+ field region 32 as indicated by the arrow. The radiant energy passes through the areas pervious to it and is absorbed in the material 31 and causes electron-hole pairs to be formed. Because of the Schottky diode junction with the n-type material 31 at the interface 38, the radiant energy is converted into current which flows through the load, electron current flowing in the external circuit toward the back electrode 34 which therefore appears as positive with respect to the external current, as indicated by polarity signs at the load L. If, however, p-type and p+-type materials are used respectively instead of n-type and n+-type materials, current will flow in the opposite direction.

A successful embodiment was constructed corresponding to FIG. 3, like the successful embodiment described in connction with FIG. 2, except that instead of a p+ layer of diffused boron, a metallic layer 36 about 600 Å thick of platinum was deposited and alloyed at about 600° C.

In the arrangement of FIG. 4, the n-type material 41 in the shape of a rectangular parallelepiped (or other geometry if desired) may have a region 42 of n+-type on one face to receive the radiant energy indicated by the arrow. Metallic regions 46 are employed to make contact to the n+ region 42. A p-n junction 48 is formed on the face opposite the region 42 by a p-type layer 49 to which contact is made by a metallic electrode 50.

The n-type material 41 may be cadmium sulfide (CdS). The n-type dopant may be indium or the presence of cadmium vacancies. The n+ region 42 may be the same material highly doped with a dopant such as indium to a concentration of $10^{16}$ atom/cc. or above. The p-type layer 49 may be of copper sulfide ($Cu_2S$), which is normally or naturally p-type due to copper vacancies. Thus, an ordinary heterojunction may serve as the layer of opposite conductivity type. In other described embodiments p+ or n+ doped layers were employed to form the p-n junctions. Nevertheless other heterojunctions may be used.

Various alternatives may be employed for the materials of the different figures. For example, gallium arsenide (GaAs), cadmium selenide (CdSe), cadmium telluride (CdTe), indium antimonide (InSb), and indium arsenide (InAs), as well as other semiconductor materials may be employed as well as appropriately doped silicon. A combination of diffusion and epitaxy techniques may be used, as well as either one, depending on the doping profiles desired, for the regions and layers.

The invention allows separate control of the characteristics of the junction, either the p-n junction or the Schottky diode junction, and the efficient collection of light. This efficiency is enhanced because the high conductivity region has low sheet resistance, and a low surface recombination velocity with enhanced effective diffusion lengths in the bulk.

What is claimed is:

1. An energy converter for the conversion of radiant energy to electrical energy comprising
    a first semiconductor material of one conductivity type having a face for receiving said radiant energy and an oppositely disposed back face, said first semiconductor material having a thickness between about 5 $\mu M$ and about 500 $\mu M$,
    a region of a semiconductor material of said one conductivity type along said energy receiving face and forming a first interface with said first semiconductor material, said region having a greater surplus of majority carriers and therefore being of greater conductivity than said first semiconductor material, said region having a thickness of between about 0.1 $\mu M$ and about 10.0 $\mu M$ and
    a layer of second material on said back face of said first semiconductor material and forming a second interface remote from said region and selected from a metallic material and a semiconductor material of opposite conductivity type, whereby a rectifying junction is formed between said first and second materials at said second interface at said back face, said layer having a thickness of between about 0.1 $\mu M$ and about 10.0 $\mu M$.

2. An energy converter as claimed in claim 1, there being on said region metallic areas pervious to said radiant energy.

3. An energy converter as claimed in claim 2, said first semiconductor material being of p-type and said region material being of p+ type.

4. An energy converter as claimed in claim 3, said layer material being of n-type.

5. An energy converter as claimed in claim 4, said first semiconductor material being silicon doped to a level of about $1.3 \times 10^{15}$ boron atoms/cc, and said region being doped to a maximum concentration of about $2 \times 10^{20}$ boron atoms/cc. said layer being doped with phosphorus to a maximum concentration of about $2 \times 10^{20}$ atoms/cc.

6. An energy converter as claimed in claim 3, said first material being of silicon, said p+ region being of silicon doped with an element selected from group IIIA of the periodic table.

7. An energy converter as claimed in claim 6, said element being selected from boron and aluminum.

8. An energy converter as claimed in claim 3, said first material being of silicon, said layer being of silicon doped with an element selected from group VA of the periodic table.

9. An energy converter as claimed in claim 8, said element being selected from phosphorus and arsenic.

10. An energy converter as claimed in claim 1, said first semiconductor material being of n-type, said region material being of n+ type.

11. An energy converter as claimed in claim 10, said second material being metallic whereby said rectifying junction is a Schottky diode.

12. An energy converter as claimed in claim 11, said second material being selected from gold, platinum, chromium, and aluminum.

13. An energy converter as claimed in claim 12, said first semiconductor material being silicon.

14. An energy converter as claimed in claim 10, said second material being of p-type.

15. An energy converter as claimed in claim 10, said second material being of p+ type.

16. An energy converter as claimed in claim 15, said first semiconductor material being 10 ohm-cm. silicon doped to a level of about $5 \times 10^{14}$ phosphorus atoms/cc, said region being doped with phosphorus to a maximum surface concentration of about $2 \times 10^{20}$ atoms/cc, and said layer being doped with boron to a maximum surface concentration of about $2 \times 10^{20}$ atoms/cc.

17. An energy converter as claimed in claim 1, further comprising a back contact applied to said layer.

* * * * *